United States Patent [19]

Asano et al.

[11] Patent Number: 5,175,199

[45] Date of Patent: Dec. 29, 1992

[54] HIGH TRANSPARENCY SILICA-TITANIA GLASS BEADS, METHOD FOR MAKING, AND LIGHT TRANSMISSION EPOXY RESIN COMPOSITIONS

[75] Inventors: Eiichi Asano; Takaaki Shimizu; Masatoshi Takita, all of Niigata; Toshio Shiobara, Gunma; Koji Futatsumori, Gunma; Kazuhiro Arai, Gunma, all of Japan

[73] Assignee: Shin-Etsu Chemical Company Limited, Tokyo, Japan

[21] Appl. No.: 651,438

[22] Filed: Feb. 7, 1991

[30] Foreign Application Priority Data

| Feb. 7, 1990 [JP] | Japan | 2-28077 |
| Feb. 7, 1990 [JP] | Japan | 2-28078 |
| Mar. 12, 1990 [JP] | Japan | 2-60669 |

[51] Int. Cl.$^5$ .......................... C08K 3/40; C08L 63/00
[52] U.S. Cl. .................................. 523/444; 523/214; 523/219
[58] Field of Search ................... 523/214, 219, 444

[56] References Cited

U.S. PATENT DOCUMENTS

| 3,171,827 | 3/1965 | de Vries | 260/40 |
| 4,842,837 | 6/1989 | Shimizu et al. | 423/335 |
| 4,985,751 | 1/1991 | Shiobara et al. | 357/72 |

FOREIGN PATENT DOCUMENTS

| 292179 | 11/1988 | European Pat. Off. |
| 383378 | 8/1990 | European Pat. Off. |

OTHER PUBLICATIONS

Chem. Abstracts, vol. 112, No. 18, Abstract No. 163830r (Apr. 1990).
Patent Abstract of Japan, vol. 14, No. 330 (C-741) (4273). (Jul. 16, 1990).
Best, M. F.; Condrate, R. A. Sr.; "A Raman Study of $TiO_2$-$SiO_2$ Glasses Prepared by Sol-Gel Processes"; Journal of Materials Science Letters, 4, 1985, 994-998.

Primary Examiner—Paul R. Michl
Assistant Examiner—U. K. Rajguru
Attorney, Agent, or Firm—Millen, White & Zelano

[57] ABSTRACT

High transparency silica-titania glass beads are characterized by a linear transmittance of at least 70% as measured at a wavelength of 900 nm to 600 nm by a specific measurement method. Such beads are prepared by hydrolyzing and polycondensing a silicon alkoxide and a titanium alkoxide to form a silica-titania sol, converting the sol into a dry gel, and then grinding the gel followed by heating or heating the gel followed by grinding. A light transmisson epoxy resin composition comprising a curable epoxy resin, a curing agent, and the high tranparency silica-titania glass beads has crack resistance and high transparency in cured state. It is useful in encapsulating optical semiconductor devices.

6 Claims, 2 Drawing Sheets

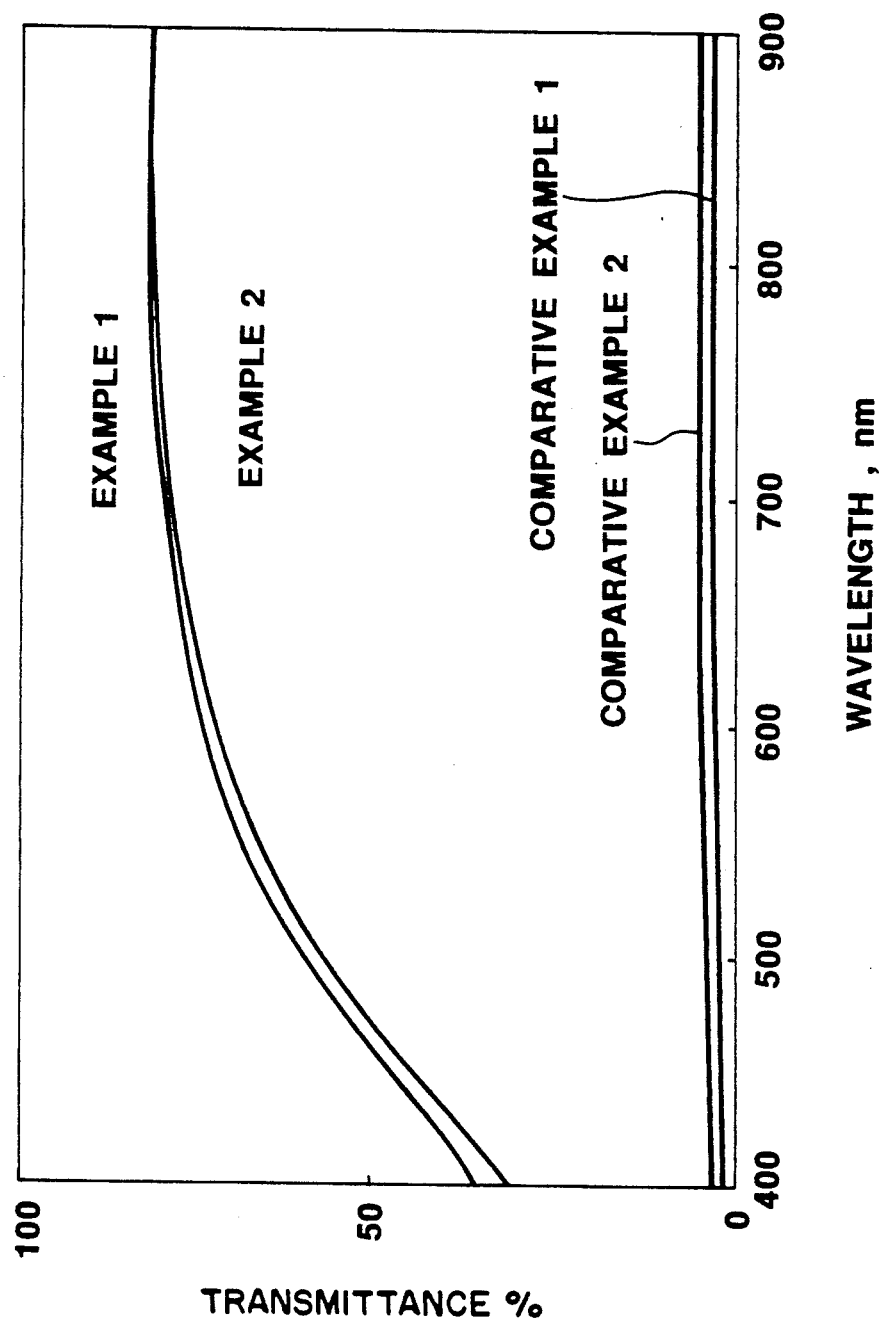

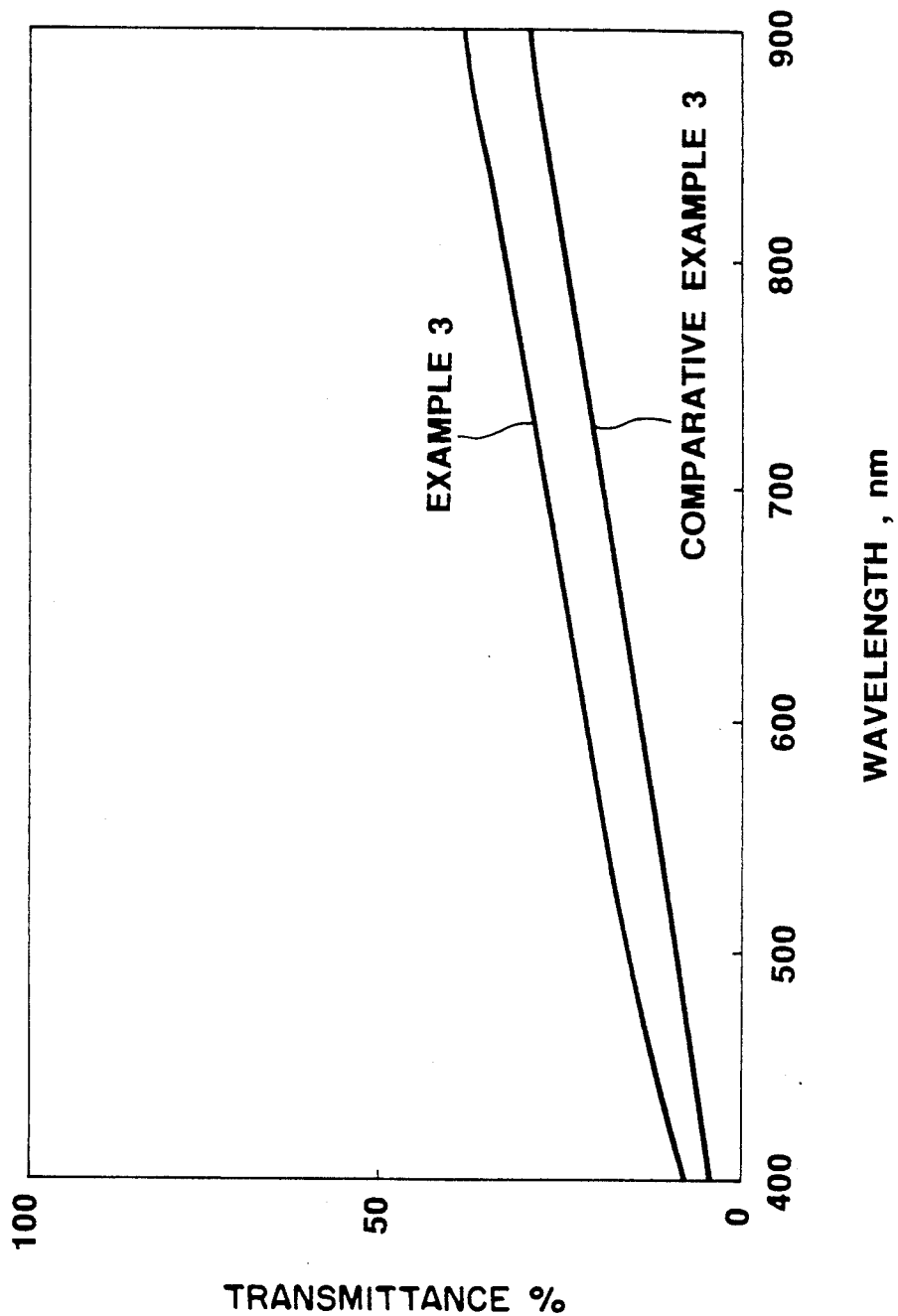

5,175,199

HIGH TRANSPARENCY SILICA-TITANIA GLASS BEADS, METHOD FOR MAKING, AND LIGHT TRANSMISSION EPOXY RESIN COMPOSITIONS

FIELD OF THE INVENTION

This invention relates to high transparency silica-titania glass beads suitable for use as fillers in molding compounds for encapsulating photofunctional devices such as LED and a method for preparing the same. It also relates a light transmission epoxy resin composition containing the glass beads which cures into products having high transparency and a low coefficient of linear expansion and is thus suitable for semiconductor encapsulation.

BACKGROUND OF THE INVENTION

At present, photofunctional devices such as LED, LD, CCD, photodiodes, and photocouplers are generally encapsulated with ceramic packages and transparent plastics. One promising material for encapsulating these devices is an epoxy molding compound in the form of a filled epoxy resin.

The fillers to be used with epoxy resins are required to have not only a high light transmittance, but also a high refractive index approximately equal to that of epoxy resins for deterring any loss of transmittance due to light scattering. By blending fillers having high transmittance and high refractive index in transparent epoxy resins, there can be obtained epoxy molding compounds which are fully transparent. Nevertheless, such fillers fulfilling both high transmittance and high refractive index have never been available in the art. There is a need for the development of such fillers.

For the protection of sophisticated electronic parts such as semiconductor devices, they were generally encapsulated with epoxy resins. The epoxy resins for this application should have excellent properties including low shrinkage, low expansion, heat resistance, and moisture resistance. In encapsulating semiconductor devices with epoxy resins, low shrinkage and low expansion are important in preventing resin cracking and element breakage. Typical prior art attempt for improving the shrinkage and expansion of epoxy resins is by blending inorganic fillers therein.

In encapsulating optical semiconductor devices such as light emitting and receiving elements with transparent epoxy resins, however, no fillers are blended in the epoxy resins so as not to detract from their transparency. Filler-free epoxy resins have a high shrinkage factor and a high coefficient of expansion when cured. Then the problems of resin cracking and element breakage arise, particularly when large-size light emitting elements are encapsulated. It was proposed to blend special fillers in epoxy resins to form transparent epoxy resin compositions. The prior art epoxy resin compositions suffered from the problem that attempts to prevent resin cracking and element breakage can reduce the transparency of epoxy resins, thus adversely affecting the optical function of elements whereas attempts to maintain transparency are not effective for preventing resin cracking and element breakage. There is a need for an epoxy resin composition capable of meeting both transparency and low stress.

In turn, it is well known in the art to prepare titania-silica ($TiO_2$-$SiO_2$) glass by hydrolyzing and polycondensing a silicon alkoxide and a titanium alkoxide in organic solvent to form a $TiO_2$-$SiO_2$ sol, and causing the sol to gel, followed by drying and sintering. This method is generally known as sol-gel method. The $TiO_2$-$SiO_2$ glass prepared by the sol-gel method is characterized by a high refractive index and a low coefficient of thermal expansion and free of impurities such as alkali metals, alkaline earth metals and chloride ions, and these features suggest potential application in a variety of uses.

However, the prior art sol-gel methods were not successful in preparing $TiO_2$-$SiO_2$ glass beads having a high content of $TiO_2$ and high transparency in the visible to near infrared range. Also, no attempts were made in the prior art for increasing the transparency of $TiO_2$-$SiO_2$ beads.

The inventors proposed in Japanese Patent Application No. 272643/1988 a method for preparing a $TiO_2$-$SiO_2$ glass which shows no absorption in the wavelength range of from 400 nm to 1300 nm, is colorless and transparent, and has a high $TiO_2$ content and a refractive index ($n_D$) of 1.53 or higher. Although this $TiO_2$-$SiO_2$ glass is colorless and transparent in outside appearance, beads obtained by grinding the glass undesirably have low light transmittance values when measured for linear transmittance by a measurement method to be defined later. The beads are thus less suitable for use as a filler in molding compounds for encapsulating photofunctional devices.

SUMMARY OF THE INVENTION

An object of the present invention is to provide a new and improved silica-titania glass beads which are high in both light transmittance and refractive index and thus suitable for use as a filler in molding compounds for encapsulating photofunctional devices. Another object is to provide a method for preparing such silica-titania glass beads.

A further object of the present invention is to provide a new and improved light transmission epoxy resin composition which cures to low stressed products having a low shrinkage factor and a low coefficient of expansion. A still further object is to provide an optical semiconductor device encapsulated with such a cured epoxy resin composition.

The inventors have found that by causing a silica-titania sol resulting from hydrolysis and polycondensation of a silicon alkoxide and a titanium alkoxide to gel, drying the gel, grinding the dry gel to a predetermined particle size, and then heating the ground gel at a temperature of 1,050° to 1,250° C. into a sintered glass, there are obtained silica-titania glass particles or beads which are more transparent than the conventional ones as demonstrated by a linear transmittance of at least 70% at a wavelength in the range of from 900 nm to 600 nm, provided that the linear transmittance is measured across a light path length of 1 nm by a specific linear transmittance measurement method A which is defined below.

Method A involves the steps of:

mixing a bisphenol type epoxy resin of the general formula (1) shown below or a novolak type epoxy resin of the general formula (2) shown below with phenylglycidyl ether to form a solution having a difference in refractive index from the silica-titania glass beads within ±0.002, mixing the solution with the silica-titania glass beads which have been ground to a mean particle diameter of 5 to 30 μm in a weight ratio of 1:1, and measuring the linear transmittance of the mixture across a light path length of 1 mm.

Formula (1):

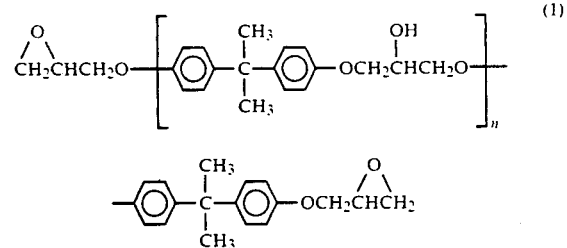

Formula (2):

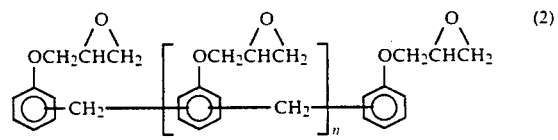

In formulae (1) and (2), n is an integer of from 0 to 10.

In conventional sol-gel methods, silica-titania glass beads are generally prepared by hydrolyzing a silicon alkoxide and a titanium alkoxide, causing the silica-titania sol to gel, aging, drying, and heating the gel to form a silica-titania glass, and thereafter grinding the glass. The products of these methods lose transparency when ground, even if they are transparent in glass state.

The inventors have found that by changing the order of steps, that is, by first grinding the dry gel prior to heating into sintered glass and then heating the ground gel at an optimum temperature of 1,050° to 1,250° C., quite unexpectedly, there are obtained silica-titania glass beads which are higher in light transmission than conventional ones. More particularly, the resulting silica-titania glass beads have high light transmittance in the visible to near infrared spectrum and allow for a choice of refractive index to be equal to that of epoxy resins by varying the content of TiO₂. The beads are thus best suited for use as a filler in molding compounds for encapsulating photofunctional devices.

Following is the reason why silica-titania glass beads having markedly improved light transmittance are obtained by the method of the present invention in which grinding of dry gel is followed by formation of sintered glass, as opposed to the conventional method in which formation of sintered glass is followed by grinding. The silica-titania glass beads obtained by grinding sintered glass have cracks and strains induced on their surface and in their interior by impacts upon grinding. When light is incident on such cracked or stressed beads, light scattering occurs due to differential refraction at the defects, resulting in a low transmittance. In contrast, the method involving first grinding a dry gel and then heating the ground gel into sintered glass state according to the present invention can produce silica-titania glass beads which are substantially free of defects because the dry gel is more brittle than the sintered glass and thus undergoes less stresses upon grinding and because the heating after grinding can mitigate the stresses. As a result, the beads show high light transmittance values.

The inventors have also found that a light transmission epoxy resin composition which cures to low stressed products having a low shrinkage factor and a low coefficient of expansion is obtained by blending silica-titania glass beads in a curable epoxy resin composition comprising a curable epoxy resin and a curing agent, the beads having a linear transmittance of at least 70% as measured at a wavelength in the range of from 900 nm to 600 nm by linear transmittance measurement method A.

In addition to high light transmittance, the silica-titania glass beads have a controllable refractive index such that the difference in refractive index between the beads and the epoxy resin may be 0.01 or less. When the silica-titania glass beads are blended in epoxy resins, there are obtained light transmission epoxy resin compositions which not only have high transparency in cured state, more specifically a light transmittance of at least 80% at a wavelength of 750 nm in 0.5 mm thickness, but also are low in shrinkage and expansion so that when used for the encapsulation of semiconductor devices, they are effective for avoiding resin cracking and element breakage.

Furthermore, the inventors have found that by causing a silica-titania sol resulting from hydrolysis and poly-condensation of a silicon alkoxide and a titanium alkoxide to gel, drying the gel, heating the dry gel at a temperature of 1,050° to 1,150° C. into a sintered glass, and then grinding the sintered glass, there are obtained silica-titania glass particles or beads which have high light transmittance in the visible to near infrared spectrum and allow for a choice of refractive index to be equal to that of epoxy resins by increasing the content of TiO₂ to increase the refractive index.

In the conventional sintering process, the dry silica-titania gel is heated at a temperature of lower than 1,000° C. into sintered glass. Now, by increasing the sintering temperature to 1,050° to 1,150° C., the sintered material can be fully consolidated while maintaining high light transmission. The fully consolidated glass can be ground into silica-titania glass beads without generating cracks or voids therein. Thus there does not occur scattering due to differential refraction at such cracks or voids in the silica-titania glass beads. Therefore, the ground silica-titania glass beads show high light transmission.

Therefore, in a first aspect, the present invention provides high transparency silica-titania glass beads having a linear transmittance of at least 70% as measured at a wavelength in the range of from 900 nm to 600 nm across a light path length of 1 mm by the above-defined measurement method A.

According to a second aspect of the present invention, there is also provided a method for preparing high transparency silica-titania glass beads, comprising the steps of: hydrolyzing and polycondensing a silicon alkoxide and a titanium alkoxide to form a silica-titania sol, causing the silica-titania sol to gel, drying the gel, grinding the dry gel to a predetermined particle size, and thereafter heating the ground gel at a temperature of 1,050° to 1,250° C. into a sintered glass.

According to a third aspect of the present invention, there is provided a method for preparing high transparency silica-titania glass beads, comprising the steps of: hydrolyzing and polycondensing a silicon alkoxide and a titanium alkoxide to form a silica-titania sol, causing the silica-titania sol to gel, drying the gel, heating the dry gel at a temperature of 1,050° to 1,150° C. into a sintered glass, and thereafter grinding the sintered glass.

According to a fourth aspect of the present invention, there is provided a light transmission epoxy resin composition comprising (A) a curable epoxy resin, (B) a curing agent. and (C) silica-titania glass beads having a linear transmittance of at least 70% as measured at a wavelength in the range of from 900 nm to 600 nm by method A. Also provided is an optical semiconductor device encapsulated with the light transmission epoxy resin composition in cured state.

BRIEF DESCRIPTION OF THE DRAWINGS

FIG. 1 is a spectrum diagram showing the light transmittance of the silica-titania glass beads obtained in Examples 1-2 and Comparative Examples 1-2.

FIG. 2 is a spectrum diagram showing the light transmittance of the silica-titania glass beads obtained in Example 3 and Comparative Example 3.

DESCRIPTION OF THE PREFERRED EMBODIMENTS

The first method for preparing high transparency silica-titania glass beads according to the present invention involves the steps of: hydrolyzing and polycondensing a silicon alkoxide and a titanium alkoxide to form a silica-titania sol, causing the silica-titania sol to gel, drying the gel, grinding the dry gel to a predetermined particle size, and thereafter heating the ground gel at a temperature of 1,050° to 1,250° C. into a sintered glass.

The first method desirably follows the method described in our Japanese Patent Application No. 272643/1988 in order to ensure that silica-titania glass beads having high transparency are produced without coloring.

More particularly, the source materials used herein are silicon alkoxides such as $Si(OCH_3)_4$ and $Si(OC_2H_5)_4$ and titanium alkoxides such as $Ti(OC_3H_7)_4$ and $Ti(OC_4H_9)_4$. The silicon and titanium alkoxides are preferably mixed such that $TiO_2$ may range from 10 to 18 mol% of the total of $SiO_2$ and $TiO_2$ in the final product. Silica-titania glass beads with a $TiO_2$ content of less than 10 mol% will sometimes have a refractive index below the minimum level of 1.53 acceptable as the epoxy resin filler. Silica-titania glass beads with a $TiO_2$ content of more than 18 mol% will often have a too high refractive index to find a matching transparent epoxy resin.

The sol or gel is obtained from these source materials by dissolving the silicon and titanium alkoxides in a diluting solvent in the form of an alcohol, often a lower alcohol such as methanol, ethanol, and propanol at a sol forming concentration of about 1 to about 90%. Water is added to the solution in a hydrolytic amount to form a silica-titania sol through hydrolysis. The sol is then poured into a gelling vessel which is closed. The vessel is placed stationarily in a constant temperature dryer where the sol is converted into gel. The temperature during this gelation and subsequent aging should preferably be 60° C. or higher because hydrolysis of alkoxides cannot proceed to completion below 60° C., leaving the likelihood of generating trivalent Ti ions which can cause coloring during subsequent sintering step. Since the aging is intended for completing the hydrolysis, the aging time is preferably at least one hour, more preferably at least 5 hours.

The wet gel resulting from gelation and aging is then dried by any desired method, for example, by removing the lid from the gelling vessel and keeping the vessel open along with the gel contents in the constant temperature dryer until the gel is dry.

In the first method, the dry gel is ground prior to sintering. That is, the dry gel is ground to a predetermined particle size rather than being directly sintered. Grinding may be carried out by conventional methods using ball mills or the like. The particle size may be suitably chosen depending on a particular application of the resulting beads. For use as the filler for photo. functional device encapsulating epoxy compounds, the average particle size preferably ranges from 1 to 100 μm, more preferably from 5 to 30 μm.

The finely divided dry gel is then heated or fired into sintered glass. The first method uses a sintering temperature in the range of from 1,050° C. to 1,250° C. At temperatures of lower than 1,050° C., the silica-titania glass beads are not fully uniformly consolidated so that they show low transmittance values because when light is directed to the beads for measuring the transmittance thereof, the light is scattered within the interior of the beads due to differential refraction at cracks or interstices in the beads. If the sintering temperature exceeds 1,250° C., the anatase phase, which is one of crystal phases of $TiO_2$, appears, preventing the formation of silica-titania glass beads having high light transmission.

Insofar as the sintering temperature falls within the above-defined range, the remaining parameters of the sintering step are not particularly limited. Preferably, electric furnaces or similar firing furnaces which can maintain a constant temperature are used while oxygen gas or a mixture of oxygen and air is introduced into the furnace to establish an oxidizing atmosphere therein effective for preventing the generation of Ti ions which will otherwise cause coloring. The furnace is typically heated at a rate of 10° to 500° C./hour until the predetermined temperature is reached. The heating or sintering time is usually 10 to 300 minutes in the above-defined temperature range.

In this way, there are obtained silica-titania glass beads having significantly high transparency, more specifically a linear transmittance of at least 70% as measured at a wavelength in the range of from 900 nm to 600 nm by linear transmittance measurement method A defined above. The silica-titania glass beads of the invention can be blended with transparent epoxy resins to form molding compounds which have high transparency, more specifically a light transmittance of at least 70% in 1 mm thickness.

The second method for preparing high transparency silica-titania glass beads according to the present invention involves the steps of hydrolyzing and poly-condensing a silicon alkoxide and a titanium alkoxide to form a silica-titania sol, causing the silica-titania sol to gel and age, drying the gel, heating the dry gel at a temperature of 1,050° to 1,150° C. into a sintered glass, and thereafter grinding the sintered glass. The steps taken until the dry gel is obtained are the same as in the first method.

That is, the second method involves heating the dry gel at a temperature of 1,050° to 1,150° C. into a sintered glass prior to grinding of the sintered glass. At temperatures of lower than 1,050° C., the gel is not converted into a fully uniformly consolidated glass so that the silica-titania glass beads obtained by grinding the glass will show very low transmittance values because when light is directed to the beads for measuring the transmittance thereof, the light is scattered within the bead interior due to differential refraction at interstices or cracks in the beads. If the sintering temperature exceeds 1,150° C., foaming can occur in the glass being sintered, and at extremely high temperatures, the anatase phase, one of crystal phases of $TiO_2$, appears, both failing to form silica-titania glass beads having high light transmission.

The sintering procedure and the subsequent grinding step are the same as in the first method.

The methods of the present invention ensure the preparation of silica-titania glass beads which have high light transmittance and high refractive index and are thus suitable as fillers in molding compounds, especially epoxy molding compounds for encapsulating photofunctional devices.

Next, the light transmission epoxy resin composition filled with the glass beads mentioned above is described.

The light transmission epoxy resin composition of the invention is defined as comprising a curable epoxy resin composition of (A) a curable epoxy resin and (B) a curing agent and having (C) specific silica-titania glass beads blended therein.

The curable epoxy resin composition is based on (A) a curable epoxy resin having at least two epoxy groups per molecule and has blended therein (B) a curing agent and an optional additive or additives. Preferably, the resin composition should have transparency as demonstrated by a light transmittance of at least 50%, most preferably at least 70% at 750 nm as measured across a cured one of 1 mm thick. The epoxy resin, curing agent, and additives are not particularly limited insofar as the curable epoxy resin composition provides such transparency.

The epoxy resin is not particularly limited in molecular structure and molecular weight as long as it can be cured with the curing agents to be described later. Any of conventional well-known epoxy resins may be used. Illustrative examples include epoxy resins synthesized from epichlorohydrin and bisphenols including various novolak resins, cycloaliphatic epoxy resins, and epoxy resins having halogen atoms such as chlorine and bromine atoms incorporated therein, alone or in admixture of two or more.

Such transparent curable epoxy resins are commercially available as Epikote 828, Epikote 1001, and Epikote 1055K (trade name, Yuka Shell Epoxy K.K.) and RE 310S and RE 304S (trade name, Nihon Kayaku K.K.) which are all bisphenol type epoxy resins.

In addition to the epoxy resins having at least two epoxy groups per molecule, any monoepoxy compounds may be used if desired. Examples of the monoepoxy compound include styrene oxide, cyclohexene oxide, propylene oxide, methylglycidyl ether, ethylglycidyl ether, phenylglycidyl ether, allylglycidyl ether, octylene oxide, and dodecene oxide.

The curing agents for epoxy resins include amine curing agents such as diaminodiphenylmethane, diaminodiphenyl sulfone, and meta-phenylenediamine; acid anhydride curing agents such as phthalic anhydride, pyromellitic anhydride, and benzophenonetetracarboxylic anhydride; and phenol novolak curing agents having at least two hydroxyl groups per molecule such as phenol novolak and cresol novolak. Most preferred among these are aromatic ring-free anhydride curing agents, for example, hexahydrophthalic anhydride and tetrahydrophthalic anhydride.

Various curing promoters may be additionally blended for promoting reaction between the curing agents and the epoxy resins. Such promoters include imidazoles and derivatives thereof, tertiary amine derivatives, phosphine derivatives, and cycloamidine derivatives.

The curing agents and curing promoters may be added in effective amounts as commonly used in the prior art epoxy resin compositions. Preferably, the curing agent is blended in amounts of 10 to 200 parts by weight, more preferably 50 to 150 parts by weight per 100 parts by weight of the epoxy resin, and the curing promoter is blended in amounts of 0 to 30 parts by weight, more preferably 1 to 5 parts by weight per 100 parts by weight of the epoxy resin.

The light transmission epoxy resin composition of the invention is obtained by blending the curable epoxy resin composition mentioned above with high transparency silica-titania glass beads having a linear transmittance of at least 70%, preferably at least 80% as measured at a wavelength in the range of from 900 nm to 600 nm by the above-defined method A.

In order to minimize the light scattering in a blend with a curable epoxy resin, the silica-titania glass beads are desirably controlled such that the difference in refractive index between the beads and the epoxy resin may be within ±0.01, more preferably within ±0.005, most preferably within ±0.002.

It is also useful to previously treat the silica-titania glass beads on their surface with carbon functional silanes.

The silica-titania glass beads are preferably blended in amounts of 10 to 600 parts, more preferably 50 to 300 parts by weight per 100 parts by weight of the curable epoxy resin composition. Less than 10 parts of the beads will be less effective for providing a low shrinkage factor and low expansion whereas more than 600 parts of the beads will yield a too viscous composition.

The light transparent epoxy resin composition of the invention is prepared by uniformly milling the curable epoxy resin composition with a suitable amount of the silica-titania glass beads in mixing means such as, for example, mixers, kneaders, roll mills, and extruders. As long as transparency is not lost, various low stress agents, mold release agents, visible light shielding agents, anti oxidants, flame retardants, and carbon functional silanes may be blended in suitable amounts, if desired. The order of blending the components is not particularly limited. Where the curable epoxy resin composition is partially or entirely solid, it is advantageously heated and melted along with all or some of the remaining components prior to mixing. Alternatively, it is dissolved in a solvent, uniformly mixed with the remaining components, and then stripped of the solvent.

The light transmitting epoxy resin compositions of the invention are unique in that they have both transparency and low stress, and particularly useful in encapsulating optical semiconductor devices. They may be applied to optical semiconductor devices such as LED by conventional molding methods, for example, transfer molding, injection molding, and casting. They are generally molded at a temperature of from 120° to 180° C., and post cured at a temperature of from 120° to 180° C. for 2 to 12 hours.

By virtue of the inclusion of well transparent silica-titania glass particles, the light transmitting epoxy resin compositions of the invention provide cured ones characterized by high transparency, a low shrinkage factor, a low coefficient of thermal expansion, and low stress. The compositions are very useful in encapsulating optical semiconductor devices. The optical semiconductor devices encapsulated with the compositions can exert their optical function to a full extent and are reliable.

EXAMPLE

Examples of the present invention are given below by way of illustration and not by way of limitation.

EXAMPLE 1

To a solution of 2083.3 grams of ethyl orthosilicate (available from Tama Kagaku Kogyo K.K.) and 672.6 grams of ethanol (guaranteed reagent, available from Wako Junyaku K.K.) at 30° C. was added 180 ml of 0.2 N hydrochloric acid solution with subsequent stirring for one hour. To the solution was gradually added 505.7 grams of titanium tetraisopropoxide (experimental reagent, available from Wako Junyaku K.K.) with subsequent stirring for another one hour. Then 668.1 grams of pure water was added with subsequent stirring for 10 minutes. The resulting $TiO_2$-$SiO_2$ sol was poured into a polypropylene container which was closed and kept at 90° C. The sol turned into gel in about 30 minutes. With the container sealed at 90° C., the gel was aged for 12 hours. Then, the container was opened and placed in a dryer at 70° C. for 4 days, obtaining a dry gel.

A 250-gram portion of the dry gel was ground for one hour in an alumina ball mill having a volume of 2 liters. The ground gel was placed in a box-shaped electric furnace which was heated to 1,100° C. over 13 hours while supplying dry air at 1.4 m³/hour and maintained at 1,100° C. for 30 minutes. There were obtained beads of sintered $TiO_2$-$SiO_2$ glass having a mean particle diameter of 23.9 μm.

This sintered $TiO_2$-$SiO_2$ glass had a refractive index ($n_D$) of 1.561 as measured by the immersion method.

EXAMPLE 2

Another 250-gram portion of the dry gel obtained in Example 1 was ground for four hours in a 2-liter alumina ball mill. The ground gel was placed in a box-shaped electric furnace which was heated to 1,100° C. over 13 hours while supplying dry air at 1.4 m³/hour and maintained at 1,100° C. for 30 minutes. There were obtained beads of sintered $TiO_2$-$SiO_2$ glass having a mean particle diameter of 10.8 μm.

COMPARATIVE EXAMPLE 1

A 250-gram portion of the dry gel obtained in Example 1 was ground for one hour in a 2-liter alumina ball mill. The ground gel was placed in a box-shaped electric furnace which was heated to 1,000° C. over 13 hours while supplying dry air at 1.4 m³/hour and maintained at 1,000° C. for 30 minutes. There were obtained beads of sintered $TiO_2$-$SiO_2$ glass having a mean particle diameter of 20.7 μm.

COMPARATIVE EXAMPLE 2

A 250-gram portion of the dry gel obtained in Example 1 was ground for one hour in a 2-liter alumina ball mill. The ground gel was placed in a box-shaped electric furnace which was heated to 1,300° C. over 13 hours while supplying dry air at 1.4 m³/hour and maintained at 1,300° C. for 30 minutes. There were obtained beads of sintered $TiO_2$-$SiO_2$ glass having a mean particle diameter of 24.3 μm.

The $TiO_2$-$SiO_2$ glass beads of Examples 1 and 2 and Comparative Examples 1-3 were measured for light transmittance with the results shown in Table 1. The light transmission spectra of the beads are plotted in FIG. 1.

The mean particle size, refractive index, and light transmittance were measured by the following procedures.

Measurement of particle size distribution

Using an aqueous solution containing 0.2% by weight of sodium hexametaphosphate as a dispersion medium for a sample, the particle size distribution was measured by means of a centrifugal settling machine, Model SA-CP3L (manufactured by Shimazu Mfg. K.K.).

Measurement of refractive index

An Abbe refractometer, Model 3T (manufactured by Atago K.K.) was used.

Measurement of light transmittance

Epikote 828 (epoxy resin available from Yuka Shell Epoxy K.K.) and phenylglycidyl ether were mixed in a controlled proportion to form a mixture having a refractive index ($n^{25}{}_D = 1.5612$) which differed within ±0.002 from the refractive index of the silica-titania glass beads as calculated from the $TiO_2$ content. The solution was mixed with the silica-titania glass beads having a mean particle diameter of 5 to 30 μm in a weight ratio of 1:1. After the beads were fully dispersed, the mixture was deaerated in vacuum until no bubbles were visually observed. A cell having a light path length of 1 mm was charged with the mixture which was measured for transmission spectrum over a wavelength range of from 900 nm to 400 nm by means of a spectrometer. The reference used was a blank.

TABLE 1

|  | E1 | E2 | CE1 | CE2 |
|---|---|---|---|---|
| Grinding after | Drying | Drying | Drying | Drying |
| Sintering temp., °C. | 1100 | 1100 | 1000 | 1300 |
| Mean particle size, μm | 23.9 | 10.8 | 20.7 | 24.3 |
| Transmittance, % |  |  |  |  |
| at 850 nm | 82.1 | 81.8 | 3.3 | 5.2 |
| 750 nm | 81.2 | 80.0 | 3.3 | 5.1 |
| 650 nm | 78.1 | 76.3 | 3.2 | 5.1 |

It is evident from Table 1 that the beads obtained by first grinding the dry gel and then firing into sintered glass, but at temperatures outside the scope of the invention (Comparative Examples 1 and 2) were opaque.

In contrast, the beads obtained by first grinding the dry gel and then firing into sintered glass at temperatures within the range between 1,050° C. and 1,250° C. (Examples 1 and 2) had a light transmittance of higher than 70%.

EXAMPLE 3

To a solution of 2083.3 grams of ethyl orthosilicate (available from Tama Kagaku Kogyo K.K.) and 672.6 grams of ethanol (guaranteed reagent, available from Wako Junyaku K.K.) at 30° C. was added 180 ml of 0.2 N hydrochloric acid solution with subsequent stirring for one hour. To the solution was gradually added 505.7 grams of titanium tetraisopropoxide (experimental reagent, available from Wako Junyaku K.K.) with subsequent stirring for another one hour. Then 668.1 grams of pure water was added with subsequent stirring for 10 minutes. The resulting $TiO_2$-$SiO2$ sol was poured into a polypropylene container which was closed and kept at 90° C. The sol turned into gel in about 30 minutes. With the container sealed at 90° C., the gel was aged for 12 hours. Then, the container was opened and placed in a dryer at 70° C. for 4 days, obtaining a dry gel.

The dry gel was placed in a box-shaped electric furnace which was heated to 1,100° C. over 13 hours while supplying dry air at 1.4 m³/hour and maintained at 1,100° C. for 30 minutes. There was obtained 740 grams of colorless transparent sintered $TiO_2$-$SiO_2$ glass. This glass had a refractive index ($n_D$) of 1.561 as measured by the immersion method.

A 250-gram portion of the sintered $TiO_2$-$SiO_2$ glass was ground for two hours in an alumina ball mill having a volume of 2 liters. There were obtained beads of sintered $TiO_2$-$SiO_2$ glass having a mean particle diameter of 19.0 μm.

COMPARATIVE EXAMPLE 3

The dry gel obtained in Example 3 was placed in a box-shaped electric furnace which was heated to 1,000° C. over 13 hours while supplying dry air at 1.4 m³/hour and maintained at 1,000° C. for 30 minutes. There was obtained 740 grams of colorless transparent sintered $TiO_2$-$SiO_2$ glass.

This sintered glass was ground as in Example 3, obtaining beads of sintered silica-titania glass having a mean particle diameter of 18.7 μm.

COMPARATIVE EXAMPLE 4

The dry gel obtained in Example 3 was placed in a box-shaped electric furnace which was heated to 1,200° C. over 13 hours while supplying dry air at 1.4 m³/hour and maintained at 1,200° C. for 30 minutes. The thus sintered glass was a foamed mass.

The $TiO_2$-$SiO_2$ glass beads of Example 3 and Comparative Example 3 were measured for light transmittance with the results shown in Table 2. The light transmission spectra of the beads are plotted in FIG. 2. The mean particle size, refractive index, and light transmittance were measured by the same procedures as in Example 1.

TABLE 2

|  | E3 | CE3 |
|---|---|---|
| Average particle size, μm | 19.0 | 18.7 |
| Sintering temp., °C. | 1100 | 1000 |
| Transmittance, % |  |  |
| at 850 nm | 36.6 | 27.6 |
| 750 nm | 30.1 | 22.0 |
| 650 nm | 24.6 | 16.8 |

EXAMPLES 4-5 AND COMPARATIVE EXAMPLES 5-6

Light transmitting epoxy resin compositions were prepared by blending 17.5 parts by weight of Epikote 828, 50.3 parts by weight of Epikote 1001 (both trade names of bisphenol A type epoxy resins, manufactured by Yuka Shell Epoxy K.K.), 32.2 parts by weight of hexahydrophthalic anhydride (trade name Rikacid HH, manufactured by Shin-Nihon Rika K.K.), 0.5 parts by weight of γ-(glycidylpropyl)trimethoxysilane, and the silica-titania glass beads obtained in Example 1 in the amount shown in Table 3, melt mixing them at 70° C. for 30 minutes, adding 0.5 parts by weight of 2-phenylimidazole to the mixture, and mixing the mixture at 70° C. for a further 10 minutes. Another light transmitting epoxy resin compositions was similarly prepared except that the silica-titania glass beads were omitted.

These compositions were measured for glass transition temperature, coefficient of linear expansion, crack resistance, and light transmittance by the following procedures. The results are shown in Table 3.

Coefficient of linear expansion (u) and glass transition temperature (Tg)

The resin compositions were molded into rod specimens having a diameter of 4 mm and a length of 15 mm which were heated at a rate of 5° C./min. by means of a dilatometer.

Crack resistance

Silicon chips of 9.0×4.5×0.5 mm were bonded to 14PIN-IC frames of 42 alloy. The resin compositions were molded on the silicon chips at 150° C. for 5 minutes, post cured at 150° C. for 4 hours, and subjected to thermal cycling between −40° C. (30 min.) and 150° C. (30 min.). Resin crack occurrence after 500 cycles was observed on ten samples for each composition.

Light transmittance

The resin compositions were molded into pieces of 1 mm thick which were measured for light transmittance at 700 nm.

TABLE 3

|  | CE5 | E4 | E5 | CE6 |
|---|---|---|---|---|
| Silica-titania glass beads, parts by weight |  |  |  |  |
| Example 1 | 0 | 50 | 100 | 0 |
| Comparison | 0 | 0 | 0 | 50 |
| Test results |  |  |  |  |
| Tg, °C. | 127 | 130 | 132 | 131 |
| μ, $10^{-5}$/°C. | 6.5 | 4.6 | 3.1 | 4.7 |
| Crack resistance, % | 100 | 20 | 0 | 30 |
| Transmittance, % | 88 | 81 | 73 | 19 |

The silica-titainia glass beads labeled "Comparison" in Table 3 were prepared as follows.

The dry gel obtained in Example 1 was placed in a box-shaped electric furnace which was heated to 1,000° C. over 13 hours while supplying dry air at 1.4 m³/hour and maintained at 1,000° C. for 30 minutes. There was obtained 740 grams of colorless transparent sintered $TiO_2$-$SiO_2$ glass.

This sintered glass was ground as in Example 1, obtaining beads of sintered silica-titania glass having the following parameters.

| Mean particle size, μm | 18.7 |
|---|---|
| Transmittance, % |  |
| at 850 nm | 27.6 |
| 750 nm | 22.0 |
| 650 nm | 16.8 |

As is evident from Table 3, the cured one of the curable epoxy resin composition free of silica-titania glass beads (Comparative Example 5) had a high coefficient of linear expansion and was thus least resistant against cracking. The cured one of the composition having blended therein silica-titania glass beads with a light transmittance of lower than 30% (Comparative Example 6) had a lower coefficient of linear expansion and hence, somewhat improved crack resistance, but with a loss of light transmittance. In contrast, the cured ones of the light transmission epoxy resin compositions having blended therein silica-titania glass beads with a light transmittance of higher than 70% (Examples 4 and 5) had a lower coefficient of linear expansion and improved crack resistance, without a substantial loss of transparency even when the beads are added in large amounts.

While there have been described herein what are considered to be preferred embodiments of the present invention, other modifications of the invention shall be apparent to those skilled in the art from the teachings herein, and it is, therefore, desired to be secured in the appended claims, all such modifications as fall within the true spirit and scope of the invention.

We claim:

1. High transparency silica-titania glass beads having a linear transmittance of at least 70% as measured at a wavelength in the range of from 900 nm to 600 nm by a linear transmittance measurement method, said method comprising mixing a bisphenol type epoxy resin of the general formula (1) shown below or a novolak type epoxy resin of the general formula (2) shown below with phenylglycidyl ether to form a solution having a difference in refractive index from the silica-titania glass beads within ±0.002, mixing the solution with the silica-titania glass beads which have been ground to a mean particle diameter of 5 to 30 μm in a weight ratio of 1:1, and measuring the linear transmittance of the mixture across a light path length of 1 mm.

wherein formula (1) is

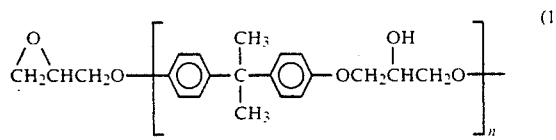

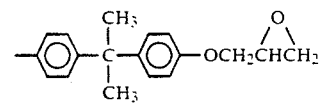

where n is an integer of from 0 to 10, and formula (2) is

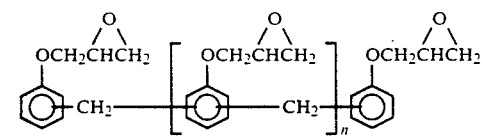

where n is an integer of from 0 to 10.

2. A method for preparing high transparency silica-titania glass beads, comprising the steps of:
hydrolyzing and polycondensing a silicon alkoxide and a titanium alkoxide to form a silica-titania sol,
forming a gel from the silica-titania sol,
drying the gel,
grinding the dry gel to a predetermined particle size, and
thereafter heating the ground gel at a temperature of 1,050° to 1,250° C. into a sintered glass.

3. A method for preparing high transparency silica-titania glass beads, comprising the steps of:
hydrolyzing and polycondensing a silicon alkoxide and a titanium alkoxide to form a silica-titania sol,
forming a gel from the silica-titania sol,
drying the gel,
heating the dry gel at a temperature of 1,050° to 1,150° C. into a sintered glass, and
thereafter grinding the sintered glass.

4. A light transmission epoxy resin composition comprising
(A) a curable epoxy resin,
(B) a curing agent, and
(C) silica-titania glass beads having a linear transmittance of at least 70% as measured at a wavelength in the range of from 900 nm to 600 nm by a linear transmittance measurement method, said method comprising mixing a bisphenol type epoxy resin of the general formula (1) shown below or a novolak type epoxy resin of the general formula (2) shown below with phenylglycidyl ether to form a solution having a difference in refractive index from the silica-titania glass beads within ±0.002, mixing the solution with the silica-titania glass beads which have been ground to a mean particle diameter of 5 to 30 μm in a weight ratio of 1:1, and measuring the linear transmittance of the mixture across a light path length of 1 mm, wherein formula (1) is

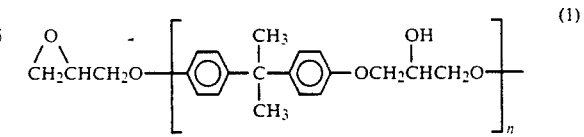

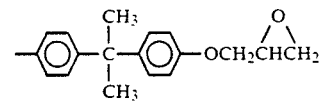

where n is an integer of from 0 to 10, and formula (2) is

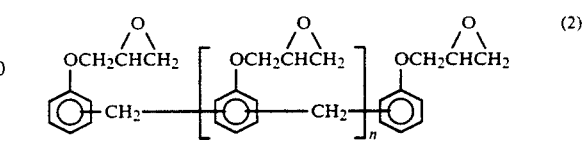

where n is an integer of from 0 to 10.

5. The composition of claim 4 wherein 10 to 600 parts by weight of the silica-titania glass beads is present per 100 parts by weight of the total of components (A) and (B).

6. An optical semiconductor device encapsulated with a cured light transmission epoxy resin composition as set forth in claim 4.

* * * * *